(12) United States Patent
Fujisawa et al.

(10) Patent No.: US 7,320,827 B2
(45) Date of Patent: Jan. 22, 2008

(54) GLASS SUBSTRATE AND METHOD OF MANUFACTURING THE SAME

(75) Inventors: Akira Fujisawa, Tokyo (JP); Koichiro Kiyohara, Tokyo (JP); Kiyotaka Ichiki, Tokyo (JP); Toru Yamamoto, Tokyo (JP)

(73) Assignee: Nippon Sheet Glass Company, Limited, Tokyo (JP)

( * ) Notice: Subject to any disclaimer, the term of this patent is extended or adjusted under 35 U.S.C. 154(b) by 382 days.

(21) Appl. No.: 10/951,038

(22) Filed: Sep. 24, 2004

(65) Prior Publication Data

US 2005/0089693 A1   Apr. 28, 2005

Related U.S. Application Data

(63) Continuation of application No. PCT/JP03/03578, filed on Mar. 25, 2003.

(30) Foreign Application Priority Data

Mar. 26, 2002   (JP) ............................. 2002-085445

(51) Int. Cl.
*B32B 17/06*   (2006.01)

(52) U.S. Cl. ...................... 428/428; 428/432; 428/698; 428/699; 428/701; 428/702

(58) Field of Classification Search ................ 428/426, 428/428, 432, 698, 699, 701, 702
See application file for complete search history.

(56) References Cited

U.S. PATENT DOCUMENTS

| 6,355,353 | B1 | 3/2002 | Hyodo et al. |
| 6,420,647 | B1* | 7/2002 | Ji et al. ........................ 136/259 |
| 6,504,139 | B1 | 1/2003 | Hirata et al. |
| 2002/0142150 | A1* | 10/2002 | Baumann et al. ........... 428/328 |

FOREIGN PATENT DOCUMENTS

| EP | 1 057 796 A1 | 12/2000 |
| JP | 2000-261013 A | 9/2000 |
| JP | 2001-48593 A | 2/2001 |
| JP | 2001-53307 A | 2/2001 |
| JP | 2002-87846 A | 3/2002 |

* cited by examiner

*Primary Examiner*—G. Blackwell
(74) *Attorney, Agent, or Firm*—Hamre, Schumann, Mueller & Larson, P.C.

(57) ABSTRACT

The present invention provides a glass substrate including a glass sheet, a thin film containing silica as its main component, and a group of metal oxide particles separated from one another, the metal oxide particles and the thin film being stacked on the glass sheet in that order from the glass sheet side, wherein the average height of the metal oxide particles is 10 to 100 nm. The present invention also provides a method of manufacturing the glass substrate, the method including forming a group of metal oxide particles by a thermal decomposition method including an inorganic metal chloride as a raw material.

6 Claims, 3 Drawing Sheets

GLASS SUBSTRATE AND METHOD OF MANUFACTURING THE SAME

This application is a continuation of international application Ser. No. PCT/JP03/03578, filed Mar. 25, 2003.

TECHNICAL FIELD

This invention relates to a glass substrate that is suitable for window glass for buildings or vehicles and is provided with a surface film having a high visible light transmittance. The invention further relates to a method of manufacturing the glass substrate.

BACKGROUND ART

The surfaces of window glasses for buildings and vehicles are provided with a transparent conductive film for reducing the total solar light transmittance while maintaining high visible light transmittance for light that enters from outdoors, and for reflecting infrared rays that enter from the interior of rooms or vehicles. The transparent conductive film contains a metal oxide such as tin oxide, titanium oxide, zinc oxide, or indium oxide as its main component, and is usually doped with fluorine or the like in order to enhance its conductivity. Photoelectric conversion devices also use glasses provided with a similar transparent conductive film. For example, a glass provided with a transparent conductive film is used in a photoelectric conversion device provided with a thin film of non-crystalline silicon or microcrystal silicon as its photoelectric conversion layer, to serve as a substrate glass on which the above thin film is to be adhered. In these photoelectric conversion devices, a transparent conductive film is formed between the glass and the photoelectric conversion layer, and further on the photoelectric conversion layer as needed, so that it functions as a thin film electrode for taking out electrons and holes generated in the photoelectric conversion layer. In addition, in order to increase the photoelectric conversion efficiency, it is necessary to guide a larger amount of light into the photoelectric conversion layer, and it is required that the transmittance for visible light and near-infrared rays is high (the reflectance is low).

This transparent conductive film contains, as described above, a metal oxide as its main component, and its refractive index is about 1.8 to 2.6, which is higher than the glass. For reference, the refractive index of ordinary glass made of a soda-lime composition is about 1.5. When a transparent conductive film is formed directly on a glass surface, the adhesiveness of the transparent conductive film tends to be insufficient because of the difference in the thermal expansion coefficients and crystal morphologies, and a problem arises that the reflectance becomes high due to the high refractive index of the transparent conductive film. Moreover, in the case of glass containing a large amount of alkaline component, such as a soda-lime glass composition, another problem arises that the alkaline component diffuses into the transparent conductive film over time, reducing the conductivity of the transparent conductive film, or reducing the adhesiveness thereof In order to solve such problems, the present inventors developed a technique for improving the adhesiveness of a transparent conductive film by forming an undercoating film made of a first layer containing a metal oxide as its main component and a second layer containing silica ($SiO_2$) as its main component, stacked in that order from the glass side, between a glass and a transparent conductive film, and by providing roughness of an appropriate size on the surface of the first layer, on which the present inventors already filed a patent application (JP 2000-261013A).

In addition, in view of the fact that the surface roughness of a transparent conductive film can be enlarged by enlarging the surface roughness of an undercoating film, the present inventors also developed a technique for forming through holes partially in the first layer of the undercoating film, in order to enhance the light trapping effect (the effect that causes the optical path length in the photoelectric conversion layer to lengthen by scattering the incident light) by enlarging the surface roughness of the transparent conductive film, on which the present inventors already filed a patent application (JP 2001-53307A). Furthermore, focusing on the fact that a refractive index-varying layer, in which the refractive index gradually changes, is formed in the surface roughness of this transparent conductive film, the present inventors also developed a technique for reducing the reflectance in the surface of the transparent conductive film by controlling the state of change in the refractive index, on which the present inventors already filed a patent application (JP 2001-48593A).

However, according to the invention described in JP 2000-261013A, the roughness is formed only on the surface of the first layer of the undercoating layer, which has a thickness of several nanometers; therefore, the size of the roughness is not necessarily sufficient and there is room for improvement in terms of increasing the adhesiveness of the transparent conductive film.

Furthermore, according to the invention described in JP 2001-53307A, although through holes are formed in the first layer of the undercoating film, these through holes dispersedly exist in places. Therefore, although the surface roughness of the transparent conductive film is large in the areas directly above the through holes, such a large surface roughness cannot be formed over the entire surface of the transparent conductive film and there is also room for improvement in enhancing the light trapping effect.

Further, the invention described in JP 2001-48593A focuses only on the refractive index-varying layer of the transparent conductive film and no research was conducted about the reflectance at the interface between the first layer and the second layer of the undercoating film, and at the interface between the undercoating film and the transparent conductive film. Thus, in this invention too, there is room for improvement in the reduction of the reflectance at the above-noted interfaces.

DISCLOSURE OF THE INVENTION

In view of the foregoing problems, the present invention has been accomplished based on the findings obtained by the results of intensive research by the present inventors. It is an object of the present invention, in at least one preferred embodiment thereof, to provide, by controlling the shape of a first layer of an undercoating film formed on a glass surface, a low-reflectance glass substrate in which adhesiveness between a glass and a transparent conductive film is high, the surface roughness of the transparent conductive film is large, its light trapping effect is effectively exhibited, and its refractive index changes gradually. It is another object of the invention to provide a method capable of manufacturing such a glass substrate easily.

The present invention provides a glass substrate including: a glass sheet; a group of metal oxide particles separated from one another; and a thin film containing silica as its main component, the group of metal oxide particles and the thin film being stacked on the glass sheet in that order from the glass sheet side, and the metal oxide particles having an average height of 10 to 100 nm.

The present invention also provides a method of manufacturing the above glass substrate, the method including forming a group of metal oxide particles by a thermal decomposition method including an inorganic metal chloride as a raw material.

BRIEF DESCRIPTION OF THE DRAWINGS

FIG. 3A shows the state of a cross section of the glass substrate observed at a magnification of 100000× and an angle of dip of 5° and FIG. 3B shows the state of the vicinity of the observed location of FIG. 3A, observed at a magnification 45000× and an angle of dip of 30°.

BEST MODE FOR CARRYING OUT THE INVENTION

Figure 1:
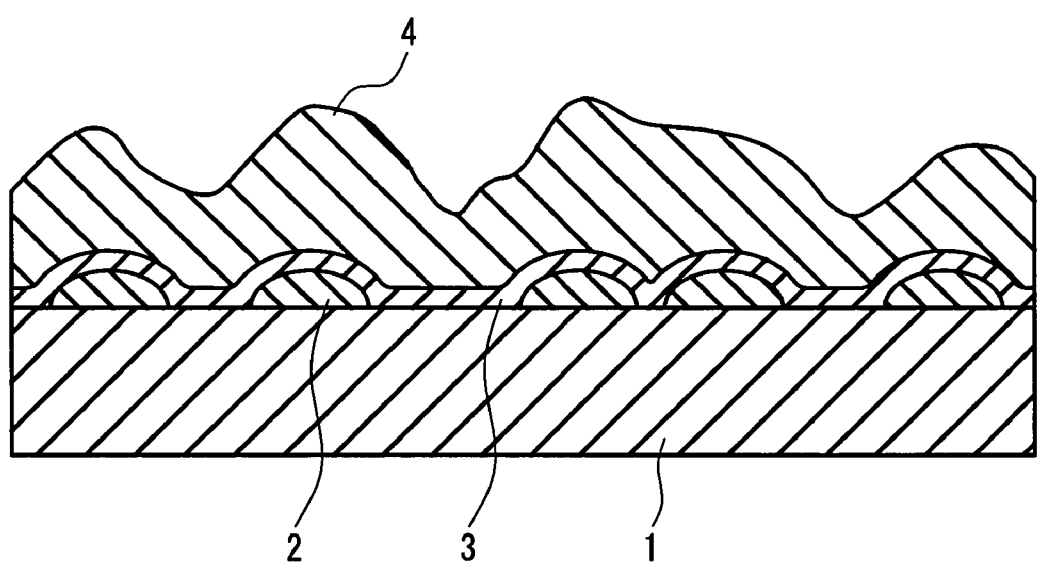
FIG. 1 is a schematic view illustrating a cross section of a glass substrate of the invention that is provided with a transparent conductive film.

In a glass substrate of the present invention, it is preferable that on a surface of a glass sheet, an occupied area percentage of metal oxide particles and an occupied area percentage of a thin film containing silica as its main component be 50 to 90% and 10 to 50%, respectively.

In the glass substrate of the present invention, it also is preferable that the outer shape of the metal oxide particles be a dome-like shape, for example, a substantially semi-spherical shape.

In the glass substrate of the present invention, it also is preferable that the metal oxide particles exist at a rate of 50 to 150 particles/$\mu m^2$ on a surface of the glass sheet.

In the glass substrate of the present invention, it also is preferable that the refractive index of the metal oxide particles be higher than the refractive index of the glass sheet and than the refractive index of the thin film containing silica as its main component.

The glass substrate of the present invention further may include a transparent conductive film on the thin film containing silica as its main component.

In a manufacturing of the present invention, the thermal decomposition method may be a chemical vapor deposition method performed on a glass ribbon in a float bath that forms the glass sheet in a manufacturing method of the glass sheet using a float method.

In this case, it is recommended that a source gas be blown at 30 to 60 cm/s against a glass ribbon having a surface temperature of 600° C. to 750° C.

It is recommended that the thermal decomposition method in the manufacturing method of the present invention use a source gas containing 0.1 to 1.0 mol % of an inorganic metal chloride.

In one embodiment of the present invention, a glass substrate includes an undercoating film in which a first layer containing a metal oxide as its main component and a second layer containing silica as its main component are stacked in that order from the glass sheet side, which has a configuration based on that of the conventional undercoating film, and a large number of metal oxide particles exist in a separated and isolated state in the portion corresponding to the first layer. In the present specification, the phrase "separated" or "separated and isolated" denotes the state in which adjacent metal oxide particles are not in contact with one another, or in which even when the metal oxide particles are joined partially, the particles are divided if the group thereof is seen as a whole.

It should be noted that when a group of separated and isolated metal oxide particles is covered with a thin film containing silica as its main component, it is very difficult to peel off only the thin film containing silica as its main component without damaging the metal oxide particles. For this reason, in the present specification, the surface configuration of the thin film containing silica as its main component is regarded as equivalent to the surface configuration of the glass substrate provided with a group of separated and isolated metal oxide particles, and it is assumed that a measurement of the surface configuration of the thin film containing silica as its main component is equivalent to a measurement of the surface configuration of the glass substrate provided with the group of separated and isolated metal oxide particles. The thin film containing silica as its main component accurately follows the surface configuration of the glass substrate provided with a group of separated and isolated metal oxide particles, as will be described later, and therefore, no technical discrepancy arises if such an assumption is made.

Figure 3A:
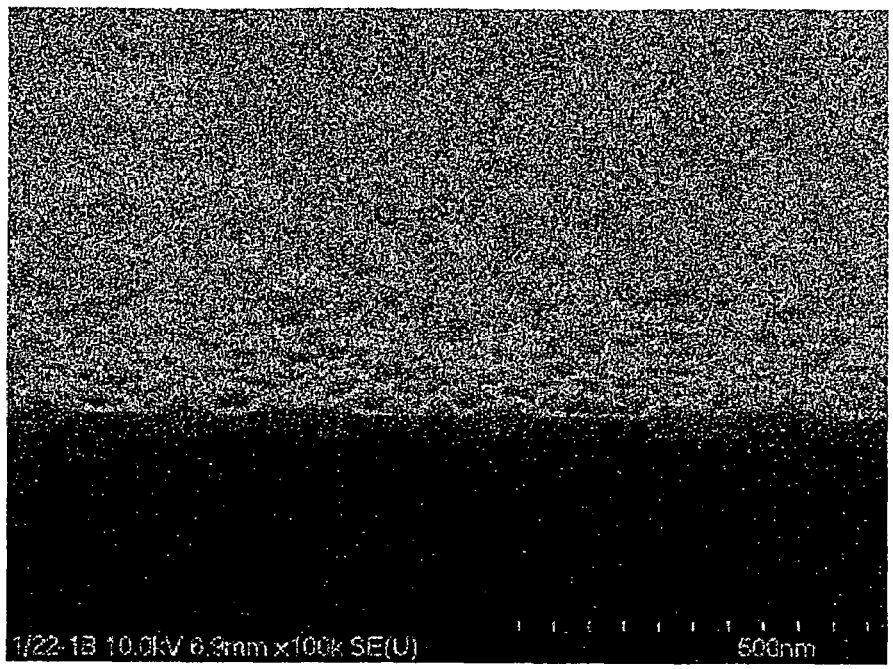
FIGS. 3A and 3B are views each illustrating a state of a thin film containing silica as its main component in a glass substrate in Example 1 after a transparent conductive film has been removed by etching, observed with a scanning electron microscope (SEM).
Figure 3B:
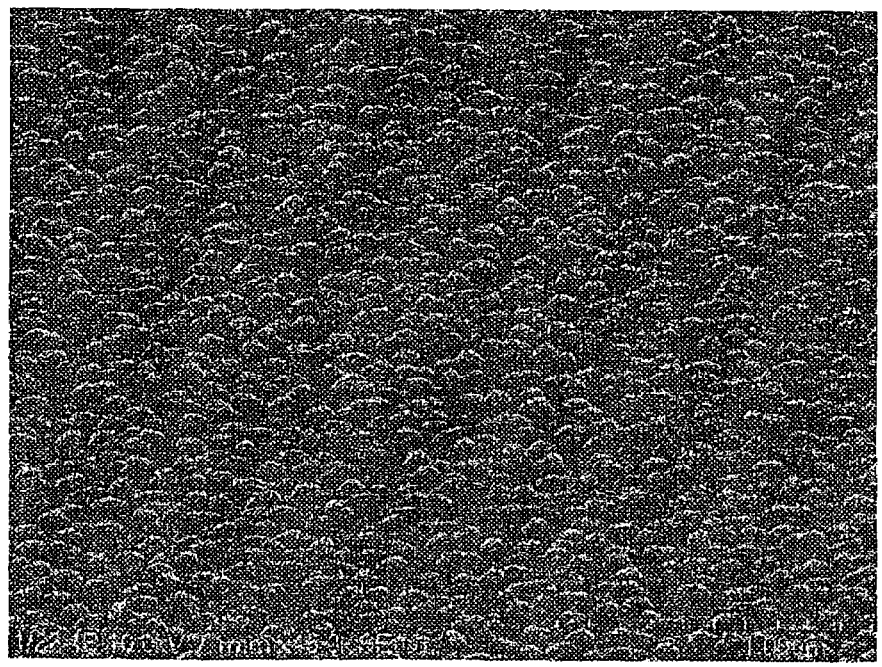

FIG. 1 schematically illustrates a cross section of this glass substrate. This glass substrate includes a group of metal oxide particles 2 separated from one another and a thin film 3 containing silica as its main component formed on a surface of a glass sheet 1 in that order, and further includes a transparent conductive film 4 on the thin film 3. FIGS. 3A and 3B illustrate a cross section and a surface of the glass substrate provided with the group of separated and isolated metal oxide particles and the thin film containing silica as its main component, observed using a SEM. It is appreciated from FIGS. 3A and 3B that metal oxide particles having a substantially semispherical shape are divided when viewed as its group as a whole, although partially joined, and they exist in a closely packed and dotted manner on the glass surface. For reference, metal oxide particles are electrically conductive; but when metal oxide particles exist in a separated and isolated manner, a glass substrate provided therewith does not show electrical conductivity because glass is an insulating material. Utilizing this feature, it is possible to confirm whether or not the metal oxide particles are separated and isolated without using a SEM. Specifically, if the surface resistance value of the glass substrate provided with a group of metal oxide particles (the state before the thin film containing silica as its main component is formed) is $1 \times 10^6$ Ω/square (Ω/□) or higher, it can be said that the metal oxide particles are separated and isolated.

The metal oxide particles contain as its main component at least one of tin oxide, titanium oxide, zinc oxide, indium oxide, and zirconium oxide, which have been used in the conventional transparent conductive film. Here, according to conventional usage, the term "main component" in this invention is intended to mean that the content thereof is 50 weight % or more. All the above-listed metal oxides are crystalline; therefore, in the case of forming metal oxide particles on a glass surface using the later-described chemical vapor deposition method (CVD method), nuclei for crystal growth first form on the glass surface, and crystal growth rapidly proceeds with the nuclei serving as starting points. When the formation of the nuclei for crystal growth is suppressed for some reason, it is possible to form a group of separated and isolated metal oxide particles. It should be noted that the formation method of a group of separated and isolated metal oxide particles using a CVD method will be detailed later.

The surface of the group of separated and isolated metal oxide particles is covered with a thin film containing silica as its main component. This thin film is continuous, and it entirely may cover not only the metal oxide particles but also the glass surface that has been left uncovered. Thereby, even when a transparent conductive film is formed on this thin film, it is made possible to prevent an alkaline component in the glass from diffusing into the transparent conductive film and degrading its properties. In addition, since the metal oxide particles exist on the glass surface in a closely packed and dotted manner, this thin film burrows into gaps between the metal oxide particles and makes contact with the glass surface at numerous points. Thus, this thin film has a configuration as if a large number of anchors are pounded into the first layer of the conventional undercoating film. Moreover, because this thin film accurately follows the surface configuration of the glass substrate provided with the group of separated and isolated metal oxide particles, the contact area between the thin film and the glass substrate is far larger than the case in which the thin film is formed on a flat glass surface. Due to the configuration in which a large number of anchors are pounded and due to the large contact area, this thin film can firmly adhere to the glass substrate. In the case in which a transparent conductive film is formed on this thin film too, the transparent conductive film can firmly adhere to the glass substrate for a similar reason. Furthermore, both this thin film and the glass have Si and O as their components and therefore the adhesiveness of this thin film with the glass is greater than that of the metal oxide particles with the glass. This is another reason why this thin film and the transparent conductive film firmly adhere to the glass substrate.

In addition, due to the fact that the thin film containing silica as its main component accurately follows the surface configuration of the glass substrate provided with the group of separated and isolated metal oxide particles as described above, roughness having substantially the same size as the particle diameter of the metal oxide particles is formed on a surface of this thin film (the surface that is more distant from the glass). The size of the roughness is several times as large as that described in the above-mentioned JP 2000-261013A, and thus, the surface roughness of the transparent conductive film formed on this thin film is accordingly larger than that described in the publication.

As described above, the refractive index of metal oxide is greater than those of glass and the thin film containing silica as its main component; accordingly, the configuration of the glass substrate including the above-described transparent conductive film can be represented in terms of the degree of refractive indices as follows: low (glass)/high (group of separated and isolated metal oxide particles)/low (thin film containing silica as its main component)/high (transparent conductive film). In order to reduce the reflectance of the glass substrate having such a configuration, it is effective to provide a refractive index-varying layer according to JP 2001-48593A, particularly a refractive index-varying layer in which the refractive index changes gradually and which has a sufficient thickness. The glass substrate of this invention, in at least a preferred embodiment thereof, employs a configuration in which the thin film containing silica as its main component burrows into gaps between the separated and isolated metal oxide particles, and therefore, the entire portion that corresponds to the conventional undercoating film functions as a refractive index-varying layer to suppress reflection effectively.

Furthermore, since the roughness having substantially the same size as the size of the metal oxide particles is formed on the surface of the thin film containing silica as its main component as described above, the surface roughness of the transparent conductive film formed thereon also becomes very large. Consequently, with the glass substrate of this invention, its reflectance further reduces due to the presence of the refractive index-varying layer on the surface of the transparent conductive film in addition to the reduction in the reflectance due to the presence of the refractive index-varying layer between the glass and the transparent conductive film. It should be noted that in the undercoating film described in JP 2000-261013A, the roughness at the interface between the first layer and the second layer is small. Further, in the undercoating film described in JP 2001-53307A or JP 2001-48593A, although through holes are formed in the first layer, the through holes are dispersed in the first layer. Therefore, the surface roughness of the transparent conductive film provided on the undercoating film described in each of these publications is smaller as a whole in comparison with that of the present invention, although it may be partially about the same size. The size of the surface roughness in an entire transparent conductive film can be confirmed by measuring its haze factor. Thus, the undercoating film described in the foregoing JP 2001-53307A or JP 2001-48593A is not that in which the film itself functions as a refractive index-varying layer, and the refractive index-varying layer in the entire transparent conductive film, which is formed on the undercoating film, is smaller than that of the present invention. Accordingly, the glass substrate described in the foregoing JP 2001-53307A or JP 2001-48593A has a high reflectance than the glass substrate of this invention. The glass substrate of this invention has an increased visible light transmittance and suppressed reflected interference color due to the reduction in reflectance, and is capable of exhibiting an outer appearance near a neutral color over a wide range of film thickness of the transparent conductive film.

Furthermore, when using the glass substrate of this invention for a photoelectric conversion device, light scattering tends to occur easily at the surface of the transparent conductive film due to its large roughness, causing a light trapping effect effectively. In addition, the amount of the light rays that enter the photoelectric conversion layer increases because of the reduction in the reflectance, improving the photoelectric conversion efficiency thereof.

The average height of the metal oxide particles is 10 to 100 nm. If the average height is less than 10 nm, the surface roughness of the group of separated and isolated metal oxide particles and the thin film containing silica as its main component (hereinafter, these may be referred to as an "undercoating film") is too small, and therefore various functions resulting from the refractive index-varying layer in the above-noted undercoating film cannot be exhibited. On the other hand, if it exceeds 100 nm, the metal oxide particles become difficult to be separated and isolated. The thickness of the refractive index-varying layer of the undercoating film is the sum of the average height of the metal oxide particles and the average thickness of the thin film containing silica as its main component. Therefore, it can be said that the average height is an important factor to determine the thickness of the refractive index-varying layer of the undercoating film. The average height of metal oxide particles can be judged, for example, according to a SEM micrograph photographed at a magnification 100000× and an angle of dip of 5°.

The thin film containing silica as its main component may contain, in addition to silica, the above-noted metal oxide at a predetermined concentration or less, e.g., at 10 mol % or less with respect to the amount of oxide. Addition of the same metal oxide as that in contact with the thin film allows the thin film to have a similar lattice constant and thermal expansion coefficient to those of the group of separated and isolated metal oxide particles or those of the transparent conductive film, making it difficult to cause cracks and peeling off.

Although the shape of the metal oxide particles is not particularly limited, a dome-like shape, particularly a substantially semispherical shape, is preferable. The reason is that the formation is easy in many cases if the particles have a dome-like shape, although it depends on the formation method of the metal oxide particles. Examples of the formation method of the group of separated and isolated metal oxide particles include, in addition to a thermal decomposition method such as a CVD method and a spraying method, a method in which metal oxide powder is coated on a glass surface and thereafter heated together with the glass to aggregate the metal oxide. With the thermal decomposition method, the metal oxide grows around the nuclei formed, and consequently, the outer shape of the particles tends to be a dome-like shape. On the other hand, with the method in which the metal oxide is aggregated, the metal oxide tends to converge in a substantially semispherical shape with a small specific surface area. Here, the term "dome-like shape" is intended to mean that a particle has no acute angle portion on the outer periphery, which extends elevating from the glass surface and reaching the glass surface, in a SEM micrograph photographed in the same manner as that described above.

It is preferable that on the glass surface, the metal oxide particles are present at a rate of 50 to 150 particles/$\mu m^2$. It should be noted that when the metal oxide particles are partially joined, the number of the metal oxide particles is measured by the number of individual metal oxide particles. For example, if two portions are confirmed in terms of the outer appearance but the particles are partially joined (in the state in which two domes can be confirmed if the particles have a dome-like shape), the metal oxide particles are counted as two particles. In addition, it is preferable that the occupied area percentage thereof be 50 to 90%. If the number of the metal oxide particles is too small, it indicates that either the particle diameter thereof is too large or the occupied area percentage thereof is too small. This means that either the metal oxide particles are not separated and isolated or the undercoating film may not be provided with a surface roughness. On the other hand, if the number of the metal oxide particles is too large, the occupied area percentage exceeds 90% and the thin film containing silica as its main component cannot burrow into gaps therebetween. As a result, the adhesiveness of the undercoating film and the transparent conductive film with glass tends to be insufficient.

In addition, it is preferable that the average thickness of the thin film containing silica as its main component be smaller than the average height of the metal oxide particles. If the thin film containing silica as its main component becomes too thick, the roughness originated from the group of separated and isolated metal oxide particles is flattened, and the surface roughness of the transparent conductive film formed thereon also becomes small. On the other hand, it is preferable that the average thickness of this thin film be 10 nm or larger in order to ensure the alkali barrier function.

Also, it is preferable that in the surface of the glass, the occupied area percentage of the metal oxide particles and the occupied area percentage of the thin film containing silica as its main component be 50 to 90% and 10 to 50%, respectively.

It is preferable that this glass substrate be provided with the transparent conductive film above the undercoating film. On this transparent conductive film, a uniform and large surface roughness is formed originating from the large surface roughness of the undercoating film. As a result, a thick refractive index-varying layer is formed on the surface of the transparent conductive film, which exhibits the above-described effects: the reduction in reflectance, the resulting suppression of reflected interference color, and the light trapping effect due to light scattering.

It is preferable that this transparent conductive film be composed of a similar metal oxide to the separated and isolated metal oxide particles, particularly of tin oxide doped with fluorine, which has high visible light transmittance and high conductivity. When the transparent conductive film is thicker, the surface resistance value becomes lower but the amount of visible light absorbed increases on the other hand. For this reason, when the transparent conductive film is used as a thin film electrode of a photoelectric conversion device, it is preferable that the thickness thereof be 200 to 2000 nm.

Since the transparent conductive film adheres firmly onto glass in the glass substrate provided with the transparent conductive film, it has such characteristics as high heat resistance and high abrasion resistance, and it also shows a high visible light transmittance and less reflected interference color because of its low reflectance. Thus, this glass substrate is suitable for use in window glasses for buildings and vehicles. Moreover, this glass substrate is also suitable for use as a glass substrate (including a cover glass) for photoelectric conversion devices because it can scatter transmission light and reflected light with the surface roughness of the transparent conductive film.

The method of forming the group of separated and isolated metal oxide particles is not particularly limited, and examples include, in addition to known thermal decomposition methods such as a CVD method or a spraying method, a method in which fine powder of a metal oxide or a metal is coated on a glass surface and thereafter heated together with the glass to aggregate the fine powder. Alternatively, after aggregating the fine powder, crystals of metal oxide particles may be grown by a thermal decomposition method using the aggregated fine powder as nucleus. Among these, a thermal decomposition method, particularly a CVD method, that uses an inorganic metal chloride as a raw material makes it possible to form the group of separated and isolated metal oxide particles easily at a high film deposition rate.

If a CVD method carried out within a float bath in which a glass ribbon in a molten state is formed in a plate shape (hereinafter referred to as a "online CVD method") is employed in a manufacturing step of a glass sheet by a float glass process, the total energy cost required for manufacturing the glass substrate can be suppressed because the energy necessary for the thermal decomposition reaction for the source gas can be obtained from the glass ribbon. Further, in the online CVD method, since the film deposition is carried out with the glass ribbon surface temperature being in a range of 560° C. to 750° C., the film deposition rate reaches as high as 5000 to 20000 nm/min. The film deposition rate in the thermal decomposition methods other than the online CVD method is usually 500 to 5000 nm/min, and therefore, it can be said that the online CVD method is a suitable method for industrial mass production.

Formation of the group of separated and isolated metal oxide particles by a CVD method can be effected by using an inorganic metal chloride as a raw material for metal oxide and adjusting the content of the metal material in the source gas to be 0.1 to 1.0 mol %. In the CVD method, an organic metal chloride is usually used as a raw material for metal oxide. For example, dimethyltin dichloride or monobutyltin trichloride is used as a raw material for tin oxide. The reason is that, in a thermal decomposition reaction, organic metal compounds show a lower reactivity than inorganic chlorides and therefore allow the film deposition to be controlled more easily (they have a wider permissible setting range for film deposition conditions). Conventionally, it has been believed that the undercoating film should be as flat as possible so that pinholes (film penetration) do not form. For this reason, the use of organic metal chloride as a raw material for the metal oxide has been reasonable even though the film deposition rate becomes slower.

However, with this invention, it is necessary to form a metal oxide into particles and further make the particles separated and isolated, contrary to conventional cases. Accordingly, upon selecting inorganic metal chloride as a raw material for a metal oxide and conducting assiduous studies on film deposition conditions therefor, the present inventors have found that a metal oxide can be made in particles and separated and isolated by controlling the content of inorganic metal chloride in the source gas. Although the technical ground is not yet clearly understood, the present inventors assume as follows. That is, an inorganic metal chloride causes a thermal decomposition reaction so as to become a metal oxide, only after being mixed and heated with an oxidizing material such as oxygen or water vapor contained in a source gas. In the thermal decomposition reaction, the components contained in the source gas applied onto a glass surface do not become completely uniform but spread over the glass surface while maintaining a constant concentration distribution. Consequently, the metal oxide forms at a location where the concentration of inorganic metal chloride is relatively high, and, with this functioning as nuclei for crystal growth along with the high reactivity of inorganic chloride, the crystal growth abruptly proceeds, forming metal oxide particles. Then, before the metal oxide particles that are present dispersedly grow and make contact with one another, the supply of the source gas is cut off to stop the crystal growth, whereby a group of separated and isolated metal oxide particles can be formed.

According to the foregoing assumption, the content of inorganic metal chloride in the source gas directly affects the formation of nuclei for crystal growth and the rate of the subsequent crystal growth. The result of an experiment conducted by the present inventors is in good agreement with the conclusion deducted from the assumption. That is, when the concentration of inorganic metal chloride in the source gas is less than 0.1 mol %, almost no metal oxide particles are observed on the glass surface or they are sparsely observed in places. The reason is thought to be as follows; because the rate of the crystal growth is slow in addition to the fact that the number of nuclei formed for crystal growth is small, the nuclei are exhausted outside the system along with the carrier gas or the like without adhering to the glass surface, or even if they have adhered onto the glass surface once, they are subsequently peeled off. On the other hand, if the concentration exceeds 1.0 mol %, the metal oxide particles grow excessively and therefore it is difficult for them to be reliably separated and isolated with a film deposition apparatus used for a normal CVD method. It should be noted that a preferable inorganic metal chloride is tin chloride (II, IV) or titanium chloride (II, III, IV).

In addition, in an online CVD method, it is possible to form reliably a group of separated and isolated metal oxide particles by blowing a source gas containing 0.1 to 1.0 mol % inorganic metal chloride and 10 to 80 mol % oxidizing material against a glass ribbon having a surface temperature of 600° C. to 750° C. at 30 to 60 cm/s. It is preferable that with a CVD method, each of the raw materials be supplied through a common channel so that a metal chloride in a gaseous state reacts with an oxidizing material and the like to a certain extent prior to the film deposition.

Although the methods for forming the thin film containing silica as its main component and the transparent conductive film are not particularly limited, it is preferable to employ the same method as that for the group of separated and isolated metal oxide particles, taking productivity into consideration. For example, if a CVD method is employed, the process from the formation of the group of separated and isolated metal oxide particles to the formation of the transparent conductive film can be performed in a series of film deposition steps by providing a plurality of coaters for supplying a source gas to the glass surface.

When the thin film containing silica as its main component is formed by a CVD method, it is possible to use as the raw material monosilane, disilane, trisilane, monochlorosilane, dichlorosilane, 1,2-dimethylsilane, 1,1,2-trimethyldisilane, 1,1,2,2-tetramethyldisilane, tetramethyl orthosilicate, or tetraethyl orthosilicate. In this case, examples of the oxidizing material include oxygen, water vapor, dry air, carbon dioxide, carbon monoxide, nitrogen dioxide, and ozone. It should be noted that when using silane, an unsaturated hydrocarbon gas such as ethylene, acetylene, or toluene may be used for the purpose of preventing silane from reacting before it reaches the glass surface.

In addition, when a thin film containing tin oxide as its main component is used as the transparent conductive film, it is preferable to add antimony or fluorine thereto in order to improve its conductivity. When forming a transparent conductive film by a CVD method, the addition of a compound of antimony or fluorine into the source gas allows them to exist in the transparent conductive film uniformly. Examples of an antimony compound include antimony trichloride and antimony pentachloride, and examples of a fluorine compound include hydrogen fluoride, trifluoroacetic acid, bromotrifluoromethane, and chlorodifluoromethane.

Figure 2:
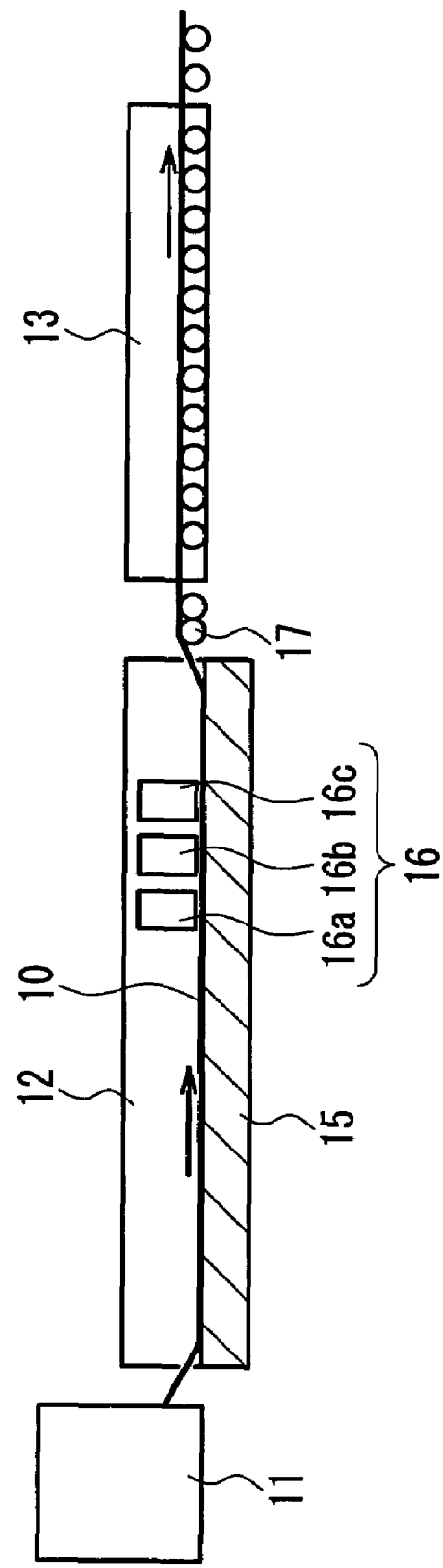
FIG. 2 is a schematic view illustrating one example of the appratus used for an online CVD method.

Hereinbelow, a preferred embodiment using an online CVD method is explained in further details. As illustrated in FIG. 2, in an apparatus used for the online CVD method, a glass ribbon 10 flows out from a melting furnace (float furnace) 11 into a float bath 12 and moves in a belt-like form on molten tin 15, and a predetermined number of coaters 16 (three coaters 16a, 16b, and 16c in the embodiment illustrated in the figure), which are spaced at a predetermined distance from the surface of the glass ribbon 10, are provided in the float bath. From these coaters, gaseous raw materials are supplied so that the group of separated and isolated metal oxide particles, the thin film containing silica as its main component, and the transparent conductive film are successively formed on the glass ribbon 10. Although not illustrated in the figure, it is possible to employ a larger number of coaters, and it is possible to further form a thin film of aluminum oxide on the thin film containing silica as its main component and to further stack a transparent conductive film composed of zinc oxide, which has a high plasma resistance, on the transparent conductive film. After the film deposition is performed, the glass ribbon 10 is pulled up by rollers 17 and is transferred to an annealing furnace 13. The glass ribbon that has been annealed in the annealing furnace 13 is cut into glass sheets having a predetermined size by a cutting apparatus, which is not shown in the figure.

EXAMPLES

Hereinbelow, the present invention is described in detail by way of example. It should be understood, however, that the invention is not to be limited to the following examples.

Example 1

Various thin films were formed using an on-line CVD method with the following setting. Specifically, 98 volume % of nitrogen and 2 volume % of hydrogen were supplied to the interior space of a float bath so that the interior space of the float bath is kept at a slightly higher pressure than that outside the bath. With the interior of the bath being kept to be a non-oxidizing atmosphere, a mixed source gas composed of tin tetrachloride (vapor), oxygen, nitrogen, and helium was supplied from a first coater located on the most upstream side to form a group of separated and isolated metal oxide particles containing tin oxide as the main component on a glass ribbon. Table 1 below sets forth the concentration of tin tetrachloride and the concentration of oxidizing material of the mixed source gas supplied from the first coater, as well as the gas flow rate for blowing the mixed source gas against the glass ribbon and the surface temperature of the glass ribbon at that time.

Subsequently, a mixed gas composed of monosilane, ethylene, oxygen, and nitrogen was supplied from a second coater to form a thin film having a film thickness of 40 nm and containing silica as its main component. Further, a mixed gas composed of tin tetrachloride (vapor), oxygen, water vapor, and nitrogen was supplied from a third coater to form a transparent conductive film having a film thickness of 50 nm and containing tin oxide as its main component.

Further, using a coater placed on a downstream side, a mixed gas composed of tin tetrachloride (vapor), water vapor, nitrogen, helium, and hydrogen fluoride was supplied at a glass ribbon temperature of 630° C. to form a transparent conductive film having a film thickness of 700 nm and containing tin oxide doped with fluorine as its main component.

With the glass substrate provided with this transparent conductive film, reflectance was measured for wavelengths of from 400 nm to 1100 nm using a spectrophotometer, with light being incident on the glass surface (light was input from the surface that is not provided with the transparent conductive film), and the measured values were sampled at a 10 nm pitch and were averaged. The average reflectance is shown in Table 1 below. Table 1 also shows a haze factor measured according to the haze measuring method (JISK7105-1981) with light being incident on the glass surface. Further, Table 1 also shows a bond strength measured according to the Test Methods for Adhesion of Thin Films on Glass Substrate (JISR3255-1997).

Next, using zinc powder as a catalyst and using diluted hydrochloric acid solution, the transparent conductive film was removed by etching. A cross section of the glass substrate on which the thin film containing silica as its main component was exposed was photographed using a SEM at a magnification of 100000× and an angle of dip of 5 degrees. The state thereof is shown in FIG. 3A. Based on FIG. 3A, the average height of the metal oxide particles was obtained. In a similar manner, the vicinity of the photographed location of FIG. 3A was photographed at a magnification 45000× and an angle of dip of 30 degrees. The state thereof is shown in FIG. 3B. Based on FIG. 3B, the occupied area percentages of the group of separated and isolated metal oxide particles and the thin film containing silica as its main component, as well as the number of the metal oxide particles per 1 $\mu m^2$ were obtained. In measuring and calculating the occupied area percentages, the location in which the undercoating film was flat according to FIG. 3B was regarded as the area occupied by the thin film containing silica as its main component.

Example 2 and Comparative Examples 1 and 2

Glass substrates each provided with a transparent conductive film were prepared in the same manner as in Example 1 except that the concentrations of the components of the mixed source gas supplied from the first coater as well as the gas flow rates and the surface temperatures of the glass ribbon at that time were varied as set forth in Table 1 below, and their properties were examined. The results of the measurement are also shown in Table 1.

Comparative Example 3

A glass substrate provided with a transparent conductive film was prepared in the same manner as in Example 1 except that dimethyltin dichloride (DMT) was used in place of tin tetrachloride in the mixed source gas supplied from the first coater, and the concentrations of the components, the gas flow rate, and the surface temperature of the glass ribbon were varied as set forth in Table 1 below, and its properties were examined. The results of the measurement are also shown in Table 1.

TABLE 1

| | | Ex. 1 | Ex. 2 | Comp. Ex. 1 | Comp. Ex. 2 | Comp. Ex. 3 |
|---|---|---|---|---|---|---|
| Source gas from first coater | Glass ribbon temperature (° C.) | 710 | 710 | 700 | 700 | 700 |
| | Metal material | $SnCl_4$ | $SnCl_4$ | $SnCl_4$ | $SnCl_4$ | DMT |
| | Concentration of metal chloride (mol %) | 0.14 | 0.52 | 0.07 | 1.2 | 0.22 |
| | Concentration of oxidizing material (mol %) | 18.7 | 18.6 | 11.6 | 57.3 | 19.4 |
| | Gas flow rate (cm/s) | 46 | 47 | 65 | 28 | 47 |

TABLE 1-continued

| | | Ex. 1 | Ex. 2 | Comp. Ex. 1 | Comp. Ex. 2 | Comp. Ex. 3 |
|---|---|---|---|---|---|---|
| Surface configuration of groups of metal oxide particles | Average height of particles (nm) | 55 | 70 | 5 | 140 | 25 |
| | Occupied area percentage (particles:silica film) | 80:20 | 90:10 | 40:60 | 95:5 | 100:0 |
| | Number of particles pre μm² | 120 | 140 | 40 | 160 | 100 |
| Properties of glass substrate | Average reflectance (%) | 8.5 | 8.6 | 8.8 | 12.6 | 9.6 |
| | Haze factor (%) | 12.5 | 13.7 | 7.9 | 35.4 | 8.1 |
| | Adhesiveness (mN) | 140 | 135 | 30 | 50 | 34 |

From the comparison between Examples and Comparative Examples, the following will be appreciated. It will be appreciated from the comparison between Example 1 and Comparative Example 1 that when the concentration of inorganic metal chloride in the mixed source gas is 0.1 mol %, the group of separated and isolated metal oxide particles having an average height of 10 nm or greater can be formed. Moreover, when the average height of the metal oxide particles is less than 10 nm, almost no improvement is seen in the haze factor of the glass substrate provided with the transparent conductive film and in the adhesiveness of the transparent conductive film.

It will be appreciated from the comparison between Example 2 and Comparative Example 2 that when the concentration of the inorganic metal chloride in the mixed source gas exceeds 1.0 mol %, the metal oxide particles become too high and too large, and consequently cannot be separated and isolated. In addition, it will be appreciated that when the metal oxide particles become too large, not only does the adhesiveness of the transparent conductive film barely improve but also the reflectance becomes rather high.

It will be appreciated from the comparison between Example 1 and Comparative Example 3 that when an organic chloride is used in a CVD method as a metal material, metal oxide particles do not form.

With the above-described configurations, the present invention attains the following advantageous effects. Metal oxide particles exist on a glass at an average height of 10 to 100 nm with being separated and isolated and forming groups, a thin film containing silica as its main component is stacked thereon so as to cover the entirety, following the surface configuration; therefore, an undercoating film made according to this configuration can firmly adhere onto the glass. Moreover, since the surface of this undercoating film is provided with a surface roughness having the same size as the average height of the metal oxide particles, the entire undercoating film functions as a refractive index-varying layer, making it possible to obtain a low-reflectance glass substrate. Furthermore, by forming a transparent conductive film on this undercoating film, the surface roughness thereof accordingly becomes very large, and consequently it becomes possible to obtain a glass substrate that has a still lower reflectance and in which the reflected interference color is lessened. By using this glass substrate provided with the transparent conductive film for a photoelectric conversion device, a larger amount of light is guided to the photoelectric conversion layer due to the high transmittance of the glass substrate, and the light trapping effect is exhibited by the transparent conductive film; thus, the photoelectric conversion efficiency of the photoelectric conversion device can be enhanced further.

Furthermore, the use of inorganic chloride as a metal material in the source gas in a thermal decomposition method, particularly in an online CVD method, makes it possible to form a group of separated and isolated metal oxide particles over a large area and within a short time. Still more, by controlling the concentration thereof in the source gas, the gas flow rate of the source gas, and the temperature blowing the source gas against the glass ribbon, it is possible to form a group of separated and isolated metal oxide particles reliably.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A glass substrate comprising:
   a glass sheet;
   a group of metal oxide particles separated from one another; and
   a thin film containing silica as its main component,
   wherein the group of metal oxide particles and the thin film are stacked on the glass sheet in that order from the glass sheet side,
   the metal oxide particles having an average height of 10 to 100 nm, and
   the metal oxide particles have an outer dome-like shape and a bottom side that contacts the glass sheet.

2. The glass substrate as set forth in claim 1, wherein an occupied area percentage of the metal oxide particles and an occupied area percentage of the thin film containing silica as its main component are 50 to 90% and 10 to 50%, respectively, on a surface of the glass sheet.

3. The glass substrate as set forth in claim 1, wherein the metal oxide particles exist at a rate of 50 to 150 particles/μm² in a surface of the glass sheet.

4. The glass substrate as set forth in claim 1, wherein the refractive index of the metal oxide particles is higher than the refractive index of the glass sheet and than the refractive index of the thin film containing silica as its main component.

5. The glass substrate as set forth in claim 1, further comprising a transparent conductive film on the thin film containing silica as its main component.

6. The glass substrate as set forth in claim 1, wherein the shape of the metal oxide particle is a substantially semispherical shape.

* * * * *